United States Patent [19]

Nercessian

[11] 4,288,739
[45] Sep. 8, 1981

[54] DYNAMIC LOAD FOR TESTING REGULATED POWER SUPPLIES

[75] Inventor: Sarkis Nercessian, Flushing, N.Y.

[73] Assignee: Kepco, Inc., Flushing, N.Y.

[21] Appl. No.: 128,850

[22] Filed: Mar. 10, 1980

[51] Int. Cl.³ .......................................... G01R 21/00
[52] U.S. Cl. ............................. 323/275; 324/158 R
[58] Field of Search ..................... 323/20, 23, 25, 40; 324/158 R

[56] References Cited

U.S. PATENT DOCUMENTS

| | | | |
|---|---|---|---|
| 3,388,317 | 6/1968 | Birman | 323/40 X |
| 3,406,341 | 10/1968 | Kupferberg et al. | 324/158 R |
| 3,435,328 | 3/1969 | Allen | 324/158 R |
| 4,004,155 | 1/1977 | Nercessian | 323/20 X |
| 4,012,685 | 3/1977 | Nercessian | 323/25 X |
| 4,042,830 | 8/1977 | Kellenbenz et al. | 324/158 R |

Primary Examiner—A. D. Pellinen
Attorney, Agent, or Firm—Alfred W. Barber

[57] ABSTRACT

A dynamic load for testing regulated power supplies comprises a pass transistor or transistors which are controlled by current or voltage regulating means operates under current regulation for loading a voltage regulated power supply and under voltage regulation for loading a current regulated power supply. Only a small bias voltage is required to keep the pass transistor in conduction when the terminal voltage of the power supply under test is programmed to zero output voltage. Otherwise the power required for the dynamic load power supply comes from the power supply under test. Programming the dynamic load power supply provides a complete range of loads to the power supply under test. Additionally, feedback from the power supply under test to the dynamic load power supply can cause the latter to simulate a fixed resistor load. The dynamic load power supply replaces a wide range of the conventional power resistors used for regulated power supply testing.

4 Claims, 4 Drawing Figures

DYNAMIC LOAD FOR TESTING REGULATED POWER SUPPLIES

PRIOR ART

The conventional way to test regulated power supplies is to load them with a resistor capable of dissipating the output power of the supply and measure the voltage across and the current flowing to this resistor. The voltage multiplied by the current is the power being delivered by the power supply. The change in voltage vs. current drawn is the regulation factor.

In order to test power supplies having a wide range of voltage and current output capabilities a wide range of power resistors is required. This usually means a large bank of variable or switchable power resistors. Manipulation of the controls of these resistors becomes a cumbersome and time consuming problem.

Regulated power supply testing has been performed by a second regulated power supply in the past as, for example, by means of the system shown and described in U.S. Pat. No. 3,406,341. However, this latter system requires the use of large capacity resistors in a wide variety of sizes to cover various ranges of power supplies being tested.

THE PRESENT INVENTION

The present invention provides a completely electronic load for testing power supplies in either voltage or current regulating mode. Basically the dynamic load comprises a control amplifier, a pass transistor (or transistors), voltage and current references. These components are interconnected so that the system acts as a voltage/current sink (as compared to a source in the case of a power supply). When testing a power supply in voltage regulating mode, the dynamic load is regulated as a current regulated sink and when testing a power supply in current regulating mode, the dynamic load is regulated as a voltage regulated sink. In this way a voltage/current regulated power supply can be tested over its full range and, since the sink is all electronic, this sink can be programmed by an automatic test control system.

Alternatively feedback can be taken from the power supply under test so that the sink acts as a constant resistance load as the voltage and/or current of the power supply under test are varied.

Accordingly, one object of the present invention is to provide an all electronic sink for testing voltage and current regulated power supplies.

Another object is to provide an all electronic sink for testing voltage/current regulated power supplies which can be programmed by means of automatic testing equipment.

Still another object is to provide a programmable electronic load for testing regulated power supplies and which does not require the use of power dissipating load resistors.

Figure 1:
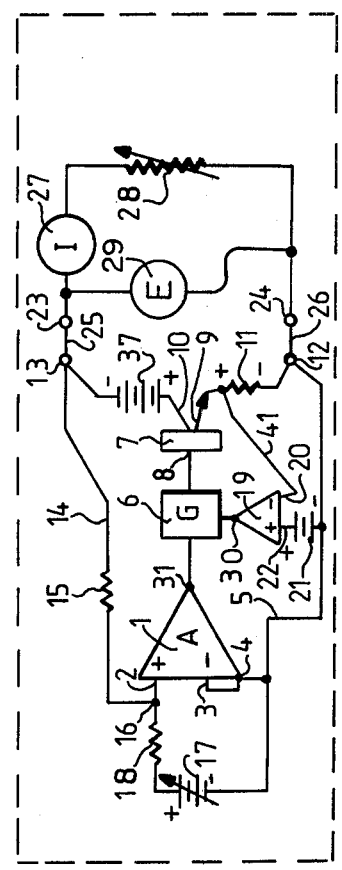
FIG. 1 is a schematic and partly block diagram showing the prior art regulated power supply testing.

FIG. 1 shows, partly in block diagram, a typical voltage/current regulated power supply connected to a test load resistor. The essential components are an error amplifier 1, a pass transistor 7 and a source of unregulated voltage 37 feeding output terminals 12 and 13 through current sensing resistor 11. Voltage regulation is provided by means of a variable reference illustrated by variable battery 17 connected from common line 5 and through input resistor 18 to non-inverting input 2 of error amplifier 1, and by feedback resistor 15 connected to input 2 at junction point 16 and over line 14 to negative output terminal 13. Inverting input 3 of amplifier 1 is connected to amplifier common point 4 and to common line 5 which in turn is connected to positive output terminal 12. Current regulation is provided by differential amplifier 19 having its inverting input terminal 20 connected over line 41 to the positive end of current sensing resistor 11 and its non-inverting input terminal 22 connected to a source of adjustable reference voltage 21 which, in turn, is connected to common line 5. The output terminal 31 of error amplifier 1 and the output terminal 30 of differential amplifier 19 are connected to gate 6 which, in turn, is connected to base 8 of pass transistor 7. Collector 10 of pass transistor 7 is connected to the positive terminal of unregulated voltage source 37, the negative terminal of which is connected to negative output terminal 13. Emitter 9 of pass transistor 7 is connected through current sensing resistor 11 to positive output terminal 12. Gate 6 passes the more positive control voltage from the two amplifiers to base 8 in order to control the output voltage or current of the power supply. This completes the description of the regulated power supply which will be seen to be a widely used basic circuit.

The load for testing the power supply comprises a variable power resistor 28 capable of absorbing the output of the power supply under test. A current meter 27 is connected between one end of resistor 28 and the load terminal 23. The other end of the resistor 28 is connected to load terminal 24. A voltmeter 29 is connected across resistor 28. Thus, the load current and voltage can be observed during testing. To complete the load circuit a link 25 is connected between power supply terminal 13 and load terminal 23, and link 26 is connected between power supply terminal 12 and load terminal 24.

The above description of FIG. 1 sets forth the conventional prior art method of testing voltage/current regulated power supplies.

Figure 2:
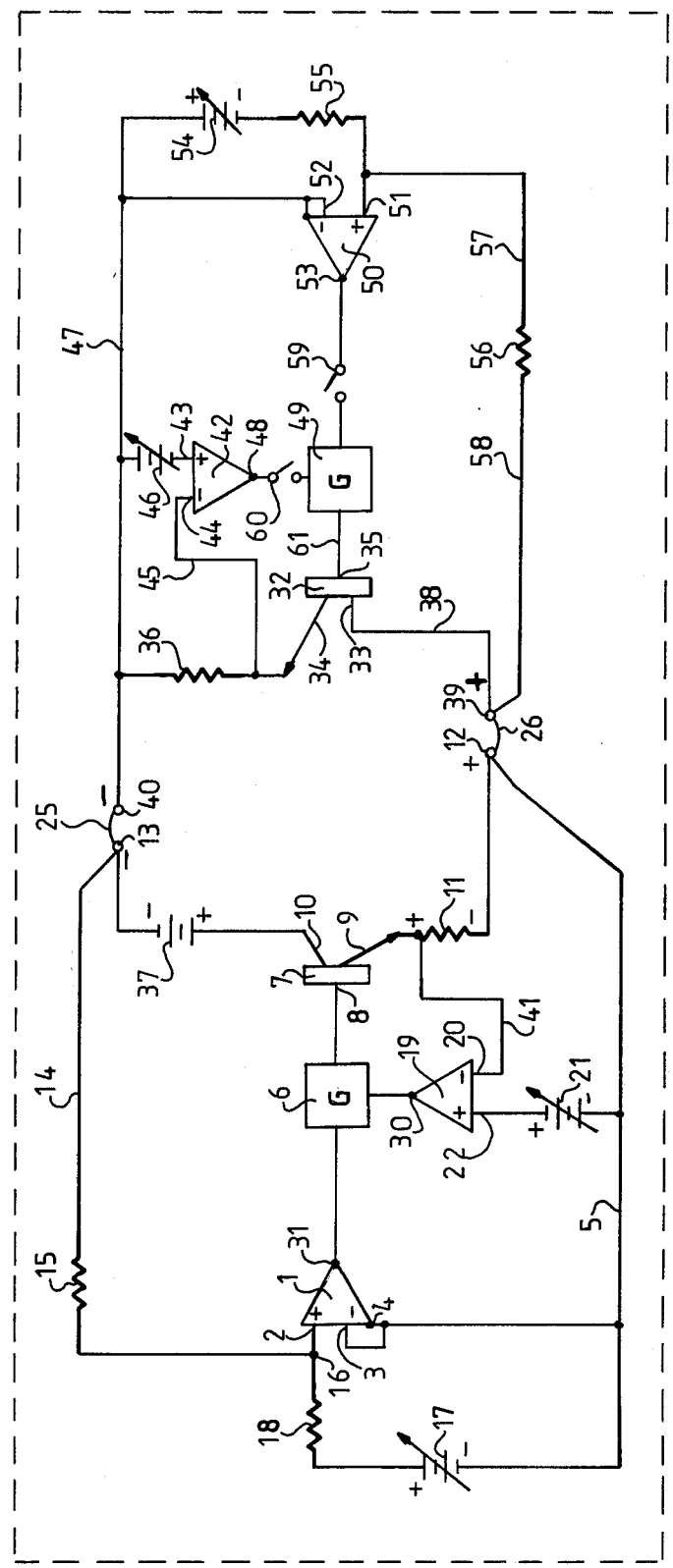
FIG. 2 is a schematic and partly block diagram of the basic form of the present invention.

FIG. 2 is schematic and partly block diagram of the basic form of the present invention. This is a dynamic programmable load circuit for testing regulated power supplies. This dynamic load is connected between terminals 39 and 40. A power transistor 32 capable of carrying the maximum voltage and current of the power supply under test is connected with its collector 33 connected over lead 38 to terminal 39 and its emitter 34 connected through resistor 36 to terminal 40. Base 35 is connected over lead 61 to gate 49 which allows only voltage or current positive with respect to common line 47 to pass. A current sensing and control circuit comprising amplifier 42 is connected with its inverting input 44 connected across current sensing resistor 36 by means of lead 45 and its non-inverting input 43 connected to the positive terminal of variable reference voltage source 46, the negative terminal of which is connected to common line 47. The output terminal 48 of amplifier 42 is connected to switch 60 which when closed, connects the output of amplifier 42 to gate 49 providing control of power transistor 32 by means of amplifier 42. A second amplifier 50 is provided with its inverting input terminal 52 connected to common line 47, its non-inverting input terminal 51 connected through input resistor 55 to the negative terminal of adjustable voltage reference source 54 the positive terminal of which is returned to common line 47. Non-inverting input terminal 51 is also connected over line 57, through gain control resistor 56 and over line 58 to terminal 39. Output terminal 53 is connected to switch 59 which, when closed, applies output voltage and current from amplifier 50 to gate 49 which, in turn, passes positive control current to base 35 of power transistor 32.

The left side of FIG. 2 will be seen to be a representation of a typical regulated power supply to be tested and described in detail above, corresponding components of the two FIGS. bearing the same reference numerals.

The following is a description of how the dynamic test system is used to test a regulated power supply. First assume that the power supply under test is in voltage regulating mode. Its output voltage programmed by means of its variable reference voltage 17. The regulated output voltage of the power supply appears across its output terminals 12 and 13. In order to load the power supply with the dynamic load, links 25 and 26 are provided connecting power supply output terminals 13 and 12 to load terminals 40 and 39 respectively. In order to load the voltage regulating power supply, the dynamic load is placed in current regulating mode by closing switch 60. The effective or apparent load resistance is then the power supply output voltage divided by the load current (R=E/I). The effective load resistance is programmed by programming the current regulation of the load by varying the value of current reference voltage 46. In this way a voltage regulated power supply can be tested very conveniently and without employing large power dissipating resistors.

Using the dynamic load to test a current regulated power supply is carried out much like the above testing of a voltage regulated power supply except the load is switched to voltage control mode. The voltage control is provided by opening switch 60 and closing switch 59. In this way the dynamic load is in voltage control mode and the terminal voltage is under the control and may be varied by varying the voltage of voltage control reference voltage 54. When the current regulated power supply is loaded by a voltage regulating dynamic load the simulated resistive load is equal to the load voltage divided by the regulated current (R=E/I). The value of the simulated load resistance is programmed by varying voltage mode reference voltage 54.

Figure 3:
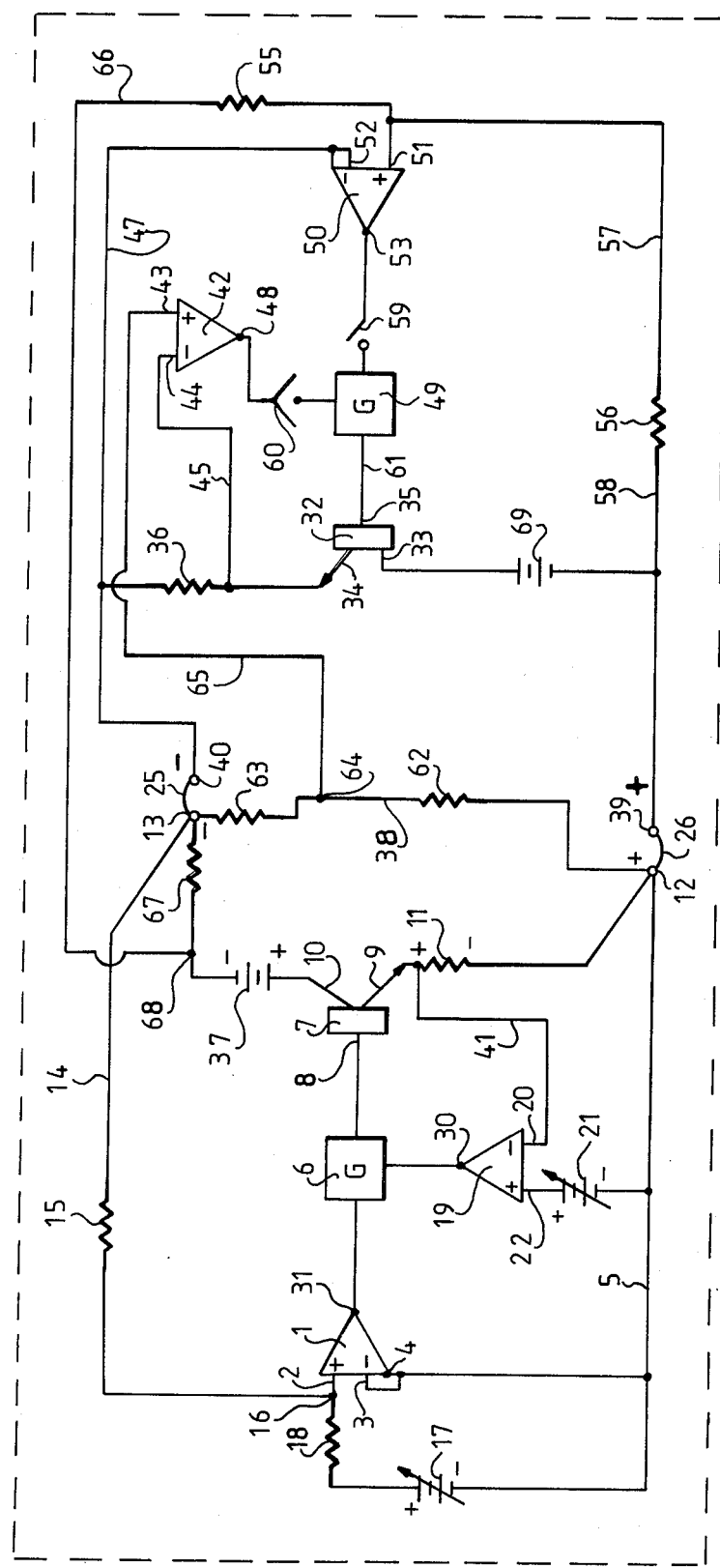
FIG. 3 is similar to FIG. 2 but with provision for feeding back current and voltage information to the electronic load so that it simulates a fixed resistor load.

FIG. 3 is similar to FIG. 2 but with provision for feeding back current and voltage information from the power supply so that the dynamic load is automatically programmed to simulate a fixed load resistor and, in addition, a bias voltage has been added to the load circuit to enable it to function down to zero output voltage from the power supply under test. Without this voltage source (69) the dynamic load receives its power solely from the power under test.

In FIG. 3, instead of using a current mode programming voltage 46 as in FIG. 2, the non-inverting input 43 of the current control amplifier 42 is returned over lead 65 to junction 64 between voltage divider resistors 62 and 63 which are bridged across the output terminals 12 and 13 of the power supply under test thereby using a portion of the output voltage as the current mode reference. Thus, the regulated load current is directly proportional to the output voltage of the power supply under test so that the dynamic load appears to be a constant resistance as the output voltage is varied. The effective value of this simulated load resistance can be varied by varying the attenuation factor as by varying resistor 63.

FIG. 3 also shows how the regulating voltage of the load can be programmed automatically, so that the load again simulates a constant resistance as the load current is varied. In place of the load voltage control voltage 54, input resistor 55 is connected over lead 66 to junction 68 which places current sensing resistor 67 in series with the output of the power supply. Thus, as the output current of the power supply under test is varied, the current flowing through current sensing resistor 67 varies accordingly and in turn varies the voltage control of the dynamic load, again simulating a fixed resistance load. If resistor 67 is varied the simulated load resistance is varied accordingly.

Figure 4:
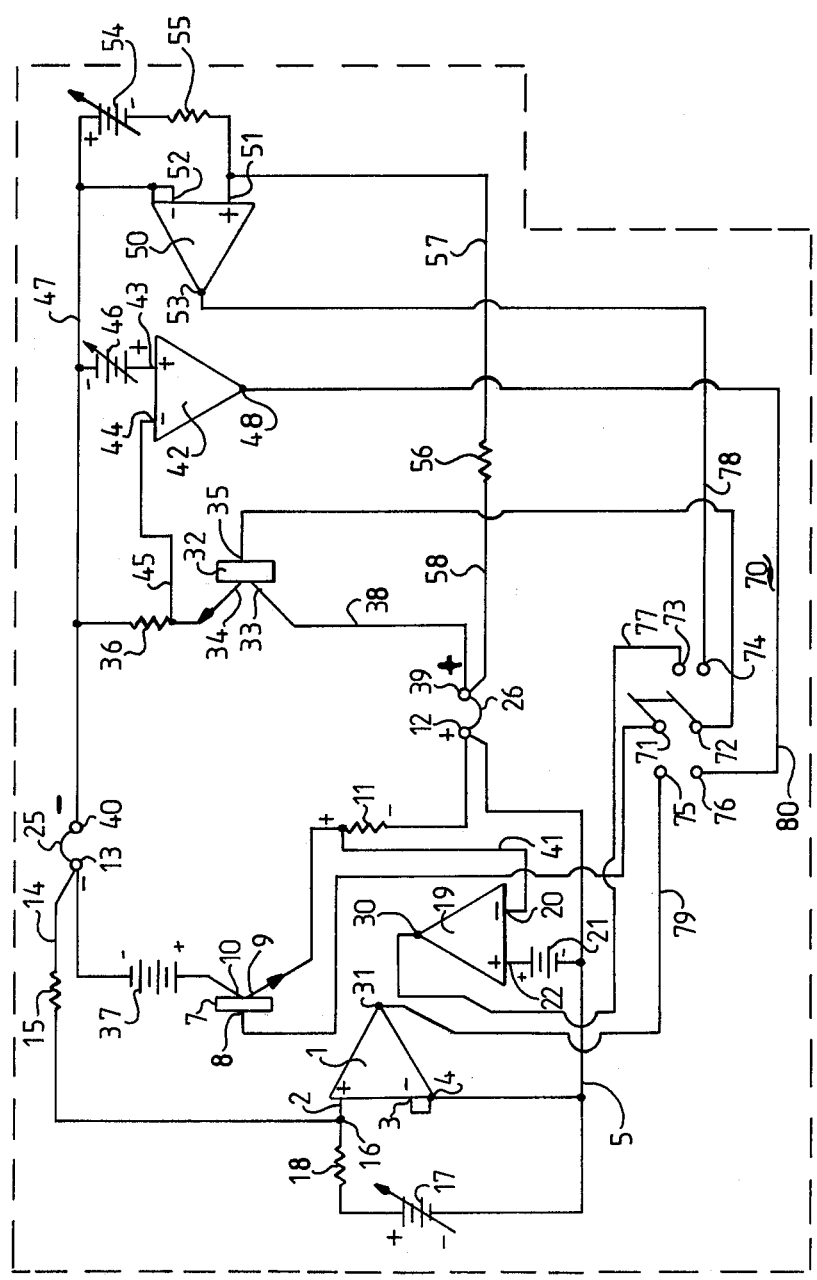
FIG. 4 is similar to FIG. 2 but with switching means which insures that the electronic load operates in the proper mode.

FIG. 4 includes the same basic circuit as that shown in FIG. 2 and described in detail above. In FIG. 4 a double pole double throw switch 70 has been added to insure that the dynamic load is in the proper mode. This switch has arms 71 and 72 and contacts 73, 74, 75 and 76. When arms 71 and 72 are closed to contacts 73 and 74, the output of the power supply current control mode amplifier 19 over lead 77 is connected to base 8 of pass transistor 7 and the output of dynamic load control amplifier 50 over lead 78 is connected to dynamic load power transistor base 35. Thus, the power supply is operating in current control mode and the dynamic load is operating in voltage regulating mode.

Similarly, when arms 71 and 72 are closed to contacts 75 and 76 respectively, the output of power supply voltage regulating amplifier 1 over lead 79 is connected to base 8 of power supply pass transistor 7 controlling the latter in voltage regulating mode and the output of dynamic load current control amplifier 42 is connected over lead 80 to the base 35 of dynamic load power transistor 32 so that the power supply is operated in voltage control mode and the dynamic load in current control mode. Thus, by using switch 70, the proper load mode is insured. The circuit of FIG. 4 is the preferred form of the present invention.

While only three forms of the present invention have been shown and described in detail, many other forms and modifications are possible within the spirit and scope of the invention as set forth, in particular, in the appended claims.

I claim:

1. In an electronic load for loading a voltage/current regulated power supply, the combination of;
    a pair of terminals for connecting to a voltage/current regulated power supply one of said terminals being designated negative, to be connected to the negative terminal of said power supply and the other being designated positive, to be connected to the positive terminal of said power supply;
    a pass transistor and current sensing resistor connected in series across said terminals with the collector of said transistor connected to said positive terminal, the emitter of said transistor connected to one end of said resistor and the other end of said resistor connected to said negative terminal;
a current regulating circuit including a comparison amplifier and a source of adjustable reference voltage connected across said current sensing resistor;
a voltage regulating circuit including a comparison amplifier, a source of adjustable reference voltage and a feedback path including a series resistor wherein said amplifier and reference voltage returns are connected to said negative terminal and said feedback path is connected to said positive terminal;
and means for connecting the output of said current regulating comparison amplifier to the base of said pass transistor for loading a voltage/current regulated power supply when said power supply is operated in voltage regulating mode,
and means for connecting the output of said voltage regulating comparison amplifier to the base of said pass transistor for loading a voltage/current regulated power supply when said power supply is operated in current regulating mode wherein the said reference voltages and feedback resistors are polled and oriented so that said electronic load acts as a voltage/current sink to a voltage/current regulated power supply connected to said terminals.

2. A dynamic load as set forth in claim 1, and including;
a source of dc voltage connected between said pass transistor collector and said positive terminal sufficient to keep said pass transistor in conduction when loading a voltage/current regulated power supply when the terminal voltage of said power supply is too low to keep said pass transistor in conduction.

3. A dynamic load as set forth in claim 1, and including;
means for automatically switching said load into voltage regulating mode and said power supply into current regulating mode and for switching said load into current regulating mode and said power supply supply into voltage regulating mode.

4. A dynamic load as set forth in claim 1, wherein the reference voltage for said current regulating circuit is derived from a portion of the output voltage of the voltage/current regulated power supply and the reference voltage for said voltage regulating circuit is derived from a sample of the output current of the voltage/current regulated power supply.

* * * * *